(12) United States Patent
Yu et al.

(10) Patent No.: US 7,131,485 B2
(45) Date of Patent: Nov. 7, 2006

(54) FAN HOLDER

(75) Inventors: Fang-Xiang Yu, Shenzhen (CN);
Shu-Ho Lin, Tu-Cheng (TW);
Meng-Tzu Lee, Tu-Cheng (TW)

(73) Assignee: Hon Hai Precision Industry Co., Ltd., Tu-Cheng (TW)

( * ) Notice: Subject to any disclaimer, the term of this patent is extended or adjusted under 35 U.S.C. 154(b) by 55 days.

(21) Appl. No.: 11/015,401

(22) Filed: Dec. 17, 2004

(65) Prior Publication Data
US 2006/0007654 A1   Jan. 12, 2006

(30) Foreign Application Priority Data
Jul. 8, 2004    (CN) .................. 2004 2 0071472

(51) Int. Cl.
*F28F 7/00*    (2006.01)
(52) U.S. Cl. ........................ 165/80.3; 165/185
(58) Field of Classification Search .......... 165/80.3, 165/185; 361/695
See application file for complete search history.

(56) References Cited

U.S. PATENT DOCUMENTS

| | | | | |
|---|---|---|---|---|
| 5,421,402 A | * | 6/1995 | Lin ........................... | 165/80.3 |
| 5,677,829 A | * | 10/1997 | Clemens ..................... | 361/697 |
| 6,311,766 B1 | * | 11/2001 | Lin et al. .................... | 165/80.3 |
| 6,343,013 B1 | * | 1/2002 | Chen .......................... | 361/695 |
| 7,004,236 B1 | * | 2/2006 | Lee et al. ................... | 165/80.3 |
| 2002/0088607 A1 | * | 7/2002 | Lo ............................. | 165/80.3 |

FOREIGN PATENT DOCUMENTS

| CN | 1214850 A | 4/1999 |
|---|---|---|
| CN | 2358381 Y | 1/2000 |

* cited by examiner

*Primary Examiner*—Teresa J. Walberg
(74) *Attorney, Agent, or Firm*—Tim Tingkang Xia, Esq.; Morris Manning Martin LLP

(57) ABSTRACT

A fan holder, for attaching a fan to a heat sink, includes a base, fasteners, and clamping arms. The fasteners extend from the base. Each of the fasteners defines an arc-shaped locking portion engaging with the fan. The clamping arms extend from the base opposite to the fasteners, and engage with the heat sink to thereby attach the fan to the heat sink.

12 Claims, 2 Drawing Sheets

FAN HOLDER

BACKGROUND OF THE INVENTION

1. Field of the Invention

The present invention relates to a holder, and particularly to a fan holder which can conveniently install a fan to a heat sink and make the fan being conveniently removed from.

2. Related Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the generated heat quickly, for example by using a heat sink attached to the CPU in the enclosure. This allows the CPU and other electronic components in the enclosure to function within ranges of their normal operating temperature, thereby assuring the quality of data management, storage and transfer. A heat dissipation device is often attached to a top surface of a CPU, to remove heat there from.

A conventional heat dissipation device comprises a heat sink and a fan defining four through holes in four corners thereof. The heat sink comprises a base, and a plurality of parallel fins extending upwardly from the base. A plurality of screw threads is formed in two outmost fins at each side of the heat sink. Four screws are received through the through holes and engaged with the screw threads. The structure can mount the fan to the heat sink, but a problem is that it is complex to install when mounting the fan to the heat sink by threads. Operation between the fan and the heat sink is difficult and efficiency is also poor.

Another conventional holder is to fasten a fan to a heat sink by a spring member. The fan defines a groove therein. The spring member usually comprises a hook engaging in the groove of the fan. The holder can conveniently to install the fan to the heat sink by the hook of the spring member engaging in the groove of the fan. However, the spring member causes a self-locking phenomenon when the hook engages in the groove of the fan. As a result, it is difficult to remove the spring member from the groove of the fan. So it is not convenient to remove the holder from the fan.

SUMMARY OF THE INVENTION

Accordingly, an object of the present invention is to provide a fan holder which can conveniently install a fan to a heat sink.

Another object of the present invention is to provide a fan holder which can make a fan being conveniently removed from.

To achieve the above-mentioned objects, a fan holder in accordance with the present invention comprises a base, fasteners, and clamping arms. The fasteners extend from the base. Each fastener defines an arc-shaped locking portion engaging with a corresponding fan. The clamping arms extend from another the base, and sandwich a heat sink therebetween.

Other objects, advantages and novel features of the present invention will be drawn from the following detailed description of a preferred embodiments of the present invention with attached drawings, in which:

DETAILED DESCRIPTION OF THE INVENTION

Figure 1:
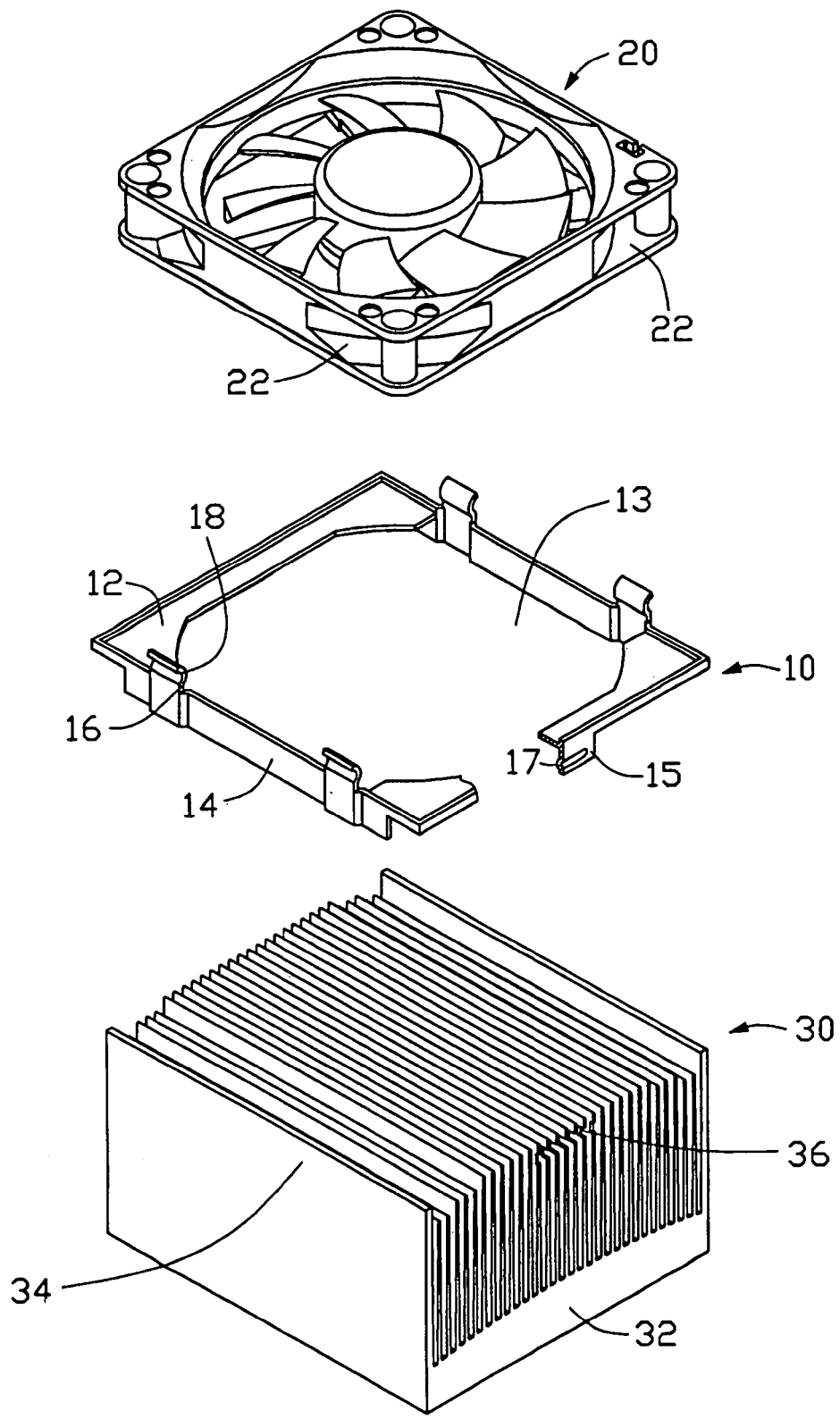
FIG. 1 is an exploded, isometric view of a fan holder in accordance with a preferred embodiment of the present invention, a fan and a heat sink, having part of the fan holder cut away.

Reference will now be made to the drawing figures to describe the present invention in detail. FIG. 1 shows a fan holder 10 in accordance with a preferred embodiment of the present invention, for mounting a fan 20 to a heat sink 30.

The fan 20 has four mounting grooves 22. The mounting grooves 22 are respectively defined in four corners of the fan 20. The heat sink 30 comprises a chassis 32 and a plurality of spaced parallel fins 34 extending from the chassis 32. Two slots 36 are formed at opposite side edges of the fins in a longitudinal direction, perpendicularly through center fins 34 of the heat sink 30 in a lateral direction.

The fan holder 10 comprises a rectangular base 12 in the preferred embodiment of the present invention. An opening 13 is defined in a center of the base 12 for providing airflow access from the fan 10 to the heat sink 20. Two pairs of spaced spring fasteners 16 extend perpendicularly from one pair of respective opposite sides of the base 12. Each spring fastener 16 defines an arc-shaped locking portion 18 for engaging with the fan 20. Two clamping arms 15 extend perpendicularly from another pair of opposite sides of the base 12, and sandwich the heat sink 30 theretween. Each clamping arm 15 has an inner hook 17. Two baffles 14 are formed on said one pair of respective opposite sides of the base 12 between the spring fasteners 16.

Figure 2:
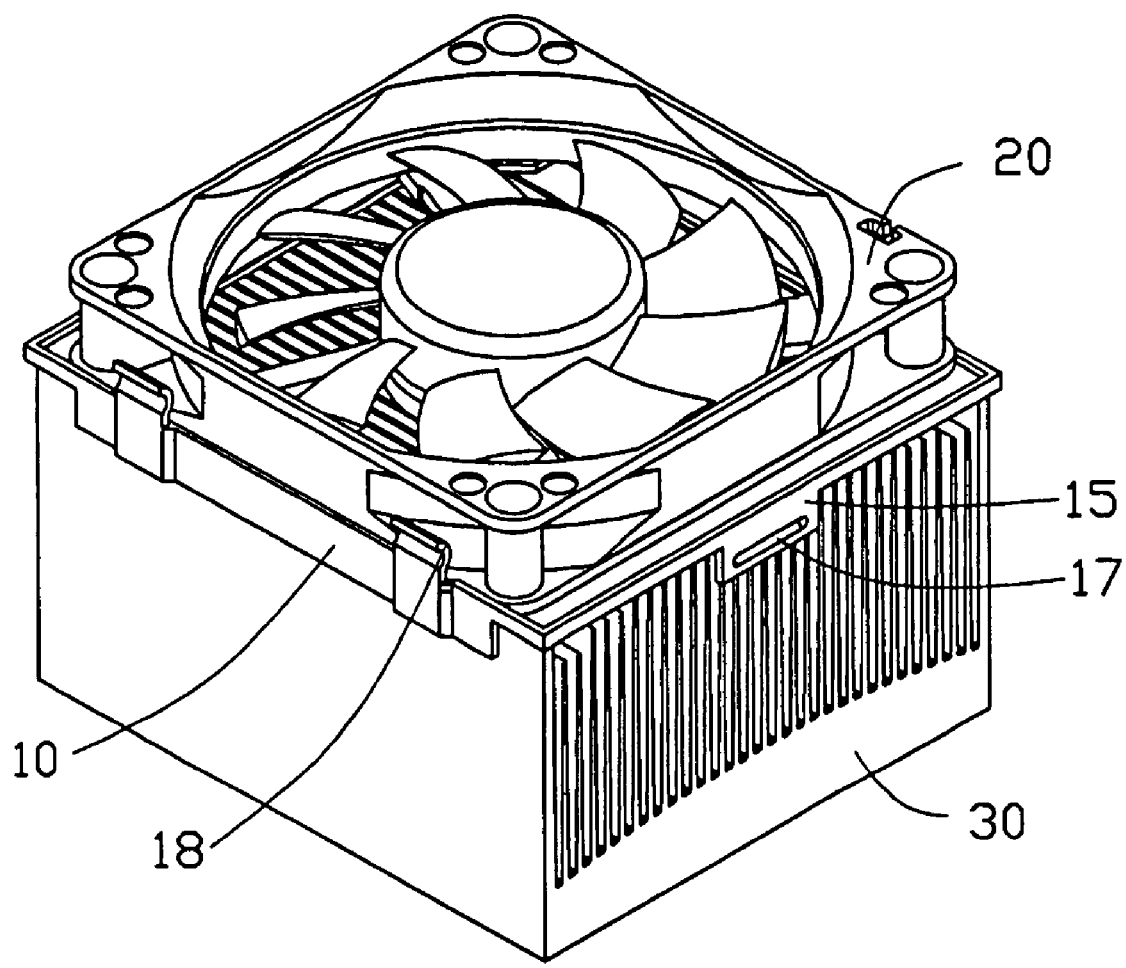
FIG. 2 is an assembled view of the fan holder, the fan and the heat sink.

Referring also to FIG. 2, in assembly, the fan 20 is placed onto the fan holder 10. The fan 20 is pressed toward the base of the fan holder 10. A bottom edge of the fan 20 outwardly pushes the locking portions 18. The spring fasteners 16 are splayed outwardly due to deformation of the locking portions 18. After the bottom edge of the fan 20 slips through the locking portions 18, the spring fasteners 16 return to their original positions. At the same time, the locking portions 18 are inserted in the mounting grooves 22, thereby firmly grasping the fan 20 on the fan holder 10. The fan 20 is thus placed onto the base 12.

A combination of the fan holder 10 and the fan 20 is placed onto a top of the heat sink 30 causing the clamping arms 15 to embrace the center fins 34 therebetween. The hooks 17 of the clamping arms 15 are engaged within the slots 36 of the heat sink 30 respectively. The baffles 14 abut against the outmost fins 34. The combined fan holder 10 and fan 20 are firmly attached to the heat sink 30.

However, when removing the fan 20 from the fan holder 10, the fan 20 is pulled. The locking portions 18 are pushed outwardly via the fan 20. The spring fasteners 16 are splayed due to deformation of the locking portions 18. Then the locking portions 18 quit from the mounting grooves 22. The spring fasteners 16 are then returned to their original positions. Finally, the fan 20 is disengaged from the fan holder 10.

In an alternative embodiment of the present invention, it is feasible that the spring fasteners 16 are slantwise extended from the base 12. It is understood that the locking portions 18 of the spring fasteners 16 may be a sphere or a hemispheroid. The baffles 14 attached to two lateral sides of the heat sink 30 may be similar in shape to the locking portions 18. Besides, the locking portions 18 directly pressed on topmost of a frame of the fan 20 are also feasible.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A fan holder for attaching a fan to a heat sink, comprising:
   a base defining an opening in a center thereof for providing airflow access from the fan to the heat sink;
   fasteners extending from the base, each of the fasteners comprising an arc-shaped locking portion for engaging with the fan; and
   clamping arms extending from a side of the base opposite to the fasteners, wherein each of the clamping arms forms an inner hook thereon for engaging with the heat sink to thereby attach the fan to the heat sink, the clamping arms cooperatively embracing the heat sink.

2. The fan holder as claimed in claim 1, wherein the locking portion is formed at a free end of the fastener.

3. A heat dissipation device comprising:
   a heat sink;
   a fan; and
   a fan holder comprising:
   a base defining an opening to allow airflow from the fan to the heat sink;
   fasteners extending from the base and deformably embracing the fan in position, the fasteners having arc shaped locking portions; and
   clamping arms extending from the base opposite to the fasteners and engaging with the heat sink to thereby attach the fan to the heat sink.

4. The heat dissipation device as claimed in claim 3, wherein the locking portion stretches from each of the fasteners into the fan and holds the fan next to the fan holder.

5. The heat dissipation device as claimed in claim 3, wherein two slots are defined in the heat sink, and wherein two inner hooks are formed on the clamping arms and the hooks are engaged in the slots.

6. The heat dissipation device as claimed in claim 4, wherein the fan defines four mounting grooves between top and bottom faces of the fan, the locking portions of the fasteners are received in the grooves.

7. The heat dissipation device as claimed in claim 3, wherein the clamping arms cooperatively embrace the heat sink.

8. An assembly comprising:
   a heat sink;
   a fan; and
   a fan holder comprising:
   a base supporting the fan thereon;
   a plurality of spaced fasteners formed from the base, the fasteners having arc shaped locking portions and being capable of embracing the fan to hold the fan in the fan holder and of allowing the fan to go into and to exit out of the fan holder due to deformation of the fasteners; and
   a plurality of spaced clamping arms formed from the base, the clamping arms embracing and engaging with the heat sink whereby the fan is attached to the heat sink.

9. The assembly as claimed in claim 8, wherein the arc-shaped locking portions permit guiding the fan in and out of the fan holder.

10. The assembly as claimed in claim 9, wherein the fan defines four mounting grooves between top and bottom faces of the fan, the locking portions of the fasteners are received in the grooves.

11. The assembly as claimed in claim 8, wherein the fasteners and the clamping arms extend from the base in an opposite manner.

12. The assembly as claimed in claim 8, wherein each of the clamping arms forms an inner hook thereon and the heat sink defines a slot therein for engagingly receiving said hook.

* * * * *